United States Patent

Shou et al.

[11] Patent Number: 5,381,352
[45] Date of Patent: Jan. 10, 1995

[54] CIRCUIT FOR MULTIPLYING AN ANALOG VALUE BY A DIGITAL VALUE

[75] Inventors: Guoliang Shou; Weikang Yang; Sunao Takatori; Makoto Yamamoto, all of Tokyo, Japan

[73] Assignee: Yozan, Inc., Tokyo, Japan

[21] Appl. No.: 170,731

[22] Filed: Dec. 21, 1993

[30] Foreign Application Priority Data

Dec. 22, 1992 [JP] Japan .................................. 4-357672

[51] Int. Cl.⁶ .............................................. G06J 1/00
[52] U.S. Cl. ................................................. 364/606
[58] Field of Search ............................. 364/606, 602

[56] References Cited

U.S. PATENT DOCUMENTS 4,422,155 12/1983 Amir et al. ........................... 364/606
4,470,126 9/1984 Haque ................................... 364/606
4,475,170 10/1984 Haque ................................... 364/606

OTHER PUBLICATIONS

Iwai, "The Beginning of Logical Circuit", The Electrical Engineering Handbook, 1980, pp. 144–146.
Miyazaki, "The Analog Usage Handbook", CQ Suppan kabushikigaisha, 1992, pp. 139–140.
"The Electrical Engineering Handbook", Richard C. Dorf, Editor–in–Chief, 1993, pp. 1861–1865.

Primary Examiner—Tan V. Mai
Attorney, Agent, or Firm—Cushman, Darby & Cushman

[57] ABSTRACT

A multiplication circuit directly multiplying an analog and a digital data without converting analog/digital or digital/analog converting. An analog input voltage is controlled by a switching signal of a digital voltage so as to generate an analog output or cut-off the outputs. Digital input signals $b_0$ to $b_7$ of a plural number of bits is integrated giving weights by means of a capacitive coupling, and a sign bit is added by a capacitive coupling CP with a double weight of the most significant bit ("MSB") of the digital input.

11 Claims, 3 Drawing Sheets

CIRCUIT FOR MULTIPLYING AN ANALOG VALUE BY A DIGITAL VALUE

FIELD OF THE INVENTION

The present invention relates to a multiplication circuit.

BACKGROUND OF THE INVENTION

In recent years, there are arguments about a limitation of a digital computer because of expotential increase in the amount of money for investments for equipment concerning to a minute processing technology. Here, an analog computer is calling attention. On the other hand, stored conventional digital technology should be used and both workings of a digital and an analog processings are necessary, and operational processing system including an analog data and a digital data is important.

However, conventionally, such an operational circuit including both an analog and a digital data without analog/digital or digital/analog converting is not known.

SUMMARY OF THE INVENTION

The present invention is invented so as to solve the conventional problems and has a purpose to provide a multiplication circuit capable of directly multiplying an analog data and a digital data without analog/digital or digital/analog converting.

A multiplication circuit according to the present invention controls an analog input voltage by a switching signal of a digital voltage so as to generate an analog output or cut-off the output. A digital input signal of a plural number of bits with giving weights by means of a capacitive coupling, and a sign bit is added by a capacitive coupling with a double of the MSB of the digital input.

PREFERRED EMBODIMENT OF THE INVENTION

Hereinafter, an embodiment of a multiplication circuit according to the present invention is described with referring to the attached drawings.

Figure 1:
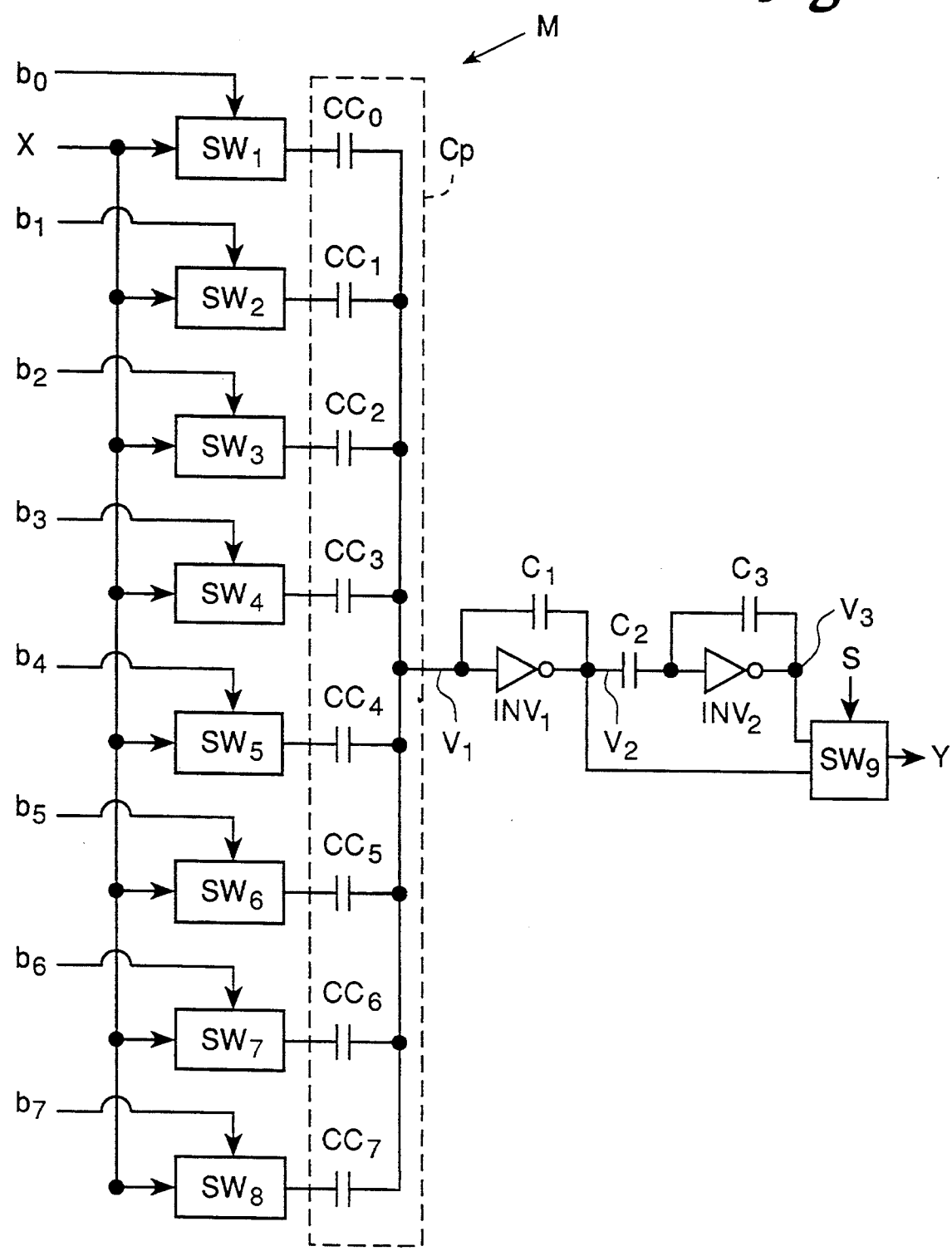
FIG. 1 is a circuit showing the first embodiment of a multiplication circuit according to the present invention.

In FIG. 1, a multiplication circuit M has a plural number of switching circuits from $SW_1$ to $SW_8$ connected with an analog input voltage X and digital input voltages from $b_0$ to $b_7$ corresponding to each bit of a digital data as a control signal to these switching circuits. Outputs of switching circuits are connected with each capacitor in a capacitive coupling CP parallelly connecting a plural number of capacitors from $CC_0$ to $CC_7$, and an output of CP generates an output as shown by following formula.

$$V_3 = = V_2(C_3/C_2) = X(C_3/C_2) \tag{11}$$

This formula is rewritten as follows under a condition of $C_2 = C_3$.

$$Y = X \tag{12}$$

As mentioned above, products of an analog input voltage X and a digital input voltage (from $b_0$ to $b_7$) are directly calculated in a multiplication circuit M and it is possible to perform inverted processing corresponding to sign bit s at $INV_1$.

Outputs of $INV_1$ and $INV_2$ are connected with a switching circuit $SW_9$, and $SW_9$ is switched by a sign bit s of a digital data. The switch $SW_9$ outputs $V_2$ or $V_3$ alternatively, as an output voltage Y. An inverted output $V_2$ of Y is output when a sign bit s is equal to 1 (high level), and a non-inverted output $V_2$ is output when a sign bit s is equal to 0 (low level).

Figure 2:
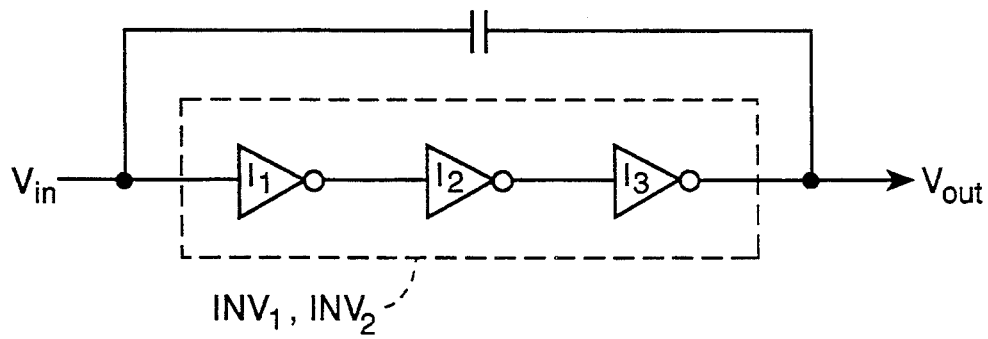
FIG. 2 is a detailed diagram showing inverter circuits $INV_1$ and $INV_2$.
Figure 3:
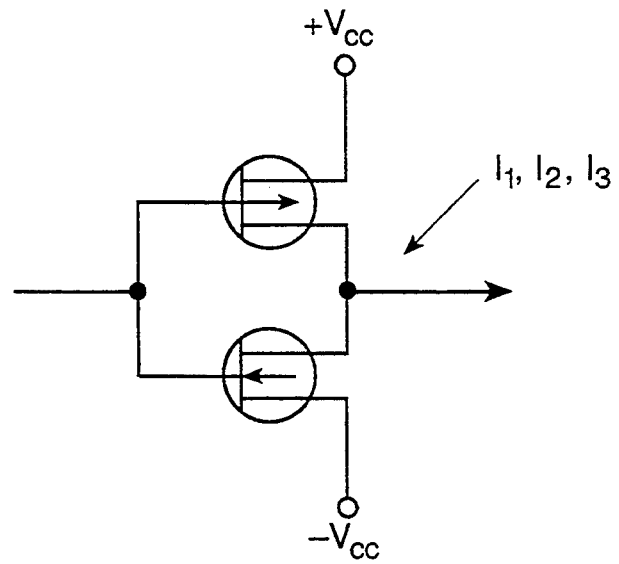
FIG. 3 is an inverter circuit in FIG. 2.

FIG. 2 shows the inside of composition of inverter circuits $INV_1$ and $INV_2$, and FIG. 3 shows an inverter circuit in FIG. 2.

As FIG. 2 shows, by serially connecting a plural number of inverters from $I_1$ and $I_3$, an output accuracy becomes higher. Inverters from $I_1$ to $I_3$ consist of nMOS and pMOS the drains of pMOS is connected with a positive voltage, the source of pMOS is connected with the drain of nMOS, and the source of nMOS is connected with a negative voltage. An input voltage is input to the gates of nMOS and pMOS. An output is generated from the junctive of both MOSs.

Figure 4:
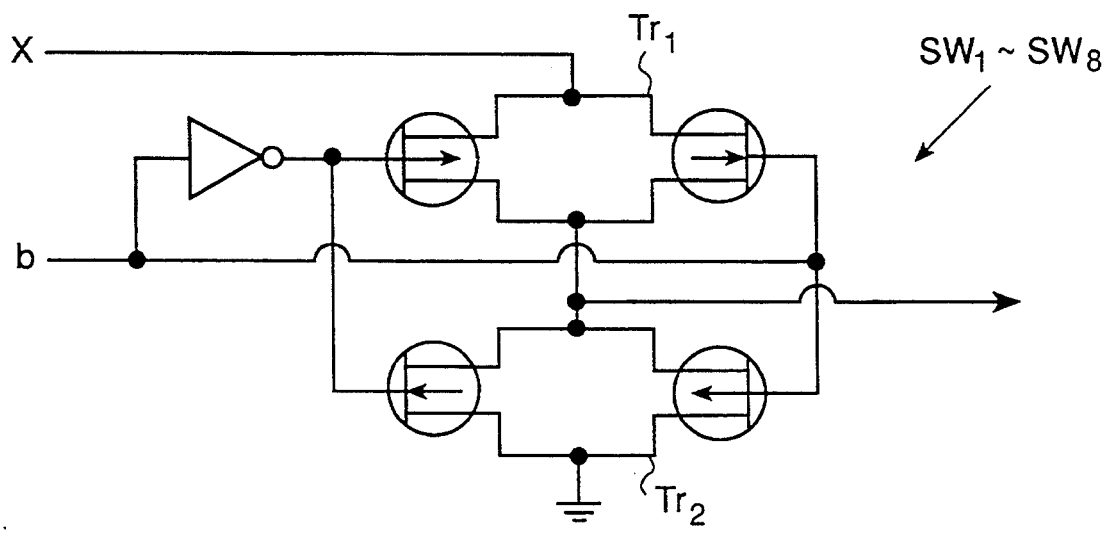
FIG. 4 is a circuit detailedly showing switching circuits from $SW_1$ to $SW_8$.

FIG. 4 shows the switching circuits from $SW_1$ to $SW_8$ in detail. The switching circuit is a CMOS switch consisting of a CMOS $Tr_1$ and a dummy transistor $Tr_2$. An output voltage X is input to a drain of $Tr_1$, and an output is generated at the junctive of $Tr_1$ and $Tr_2$. A digital input voltage is invertedly connected to the gate of pMOS of $Tr_1$ and the gate of nMOS of $Tr_2$ and non-invertedly connected to the gate of mMOS of $Tr_1$ and the gate of pMOS of $Tr_2$. As a result, it is possible to realize opening and closing of an analog input voltage with little voltage drop at a switch.

Figure 5:
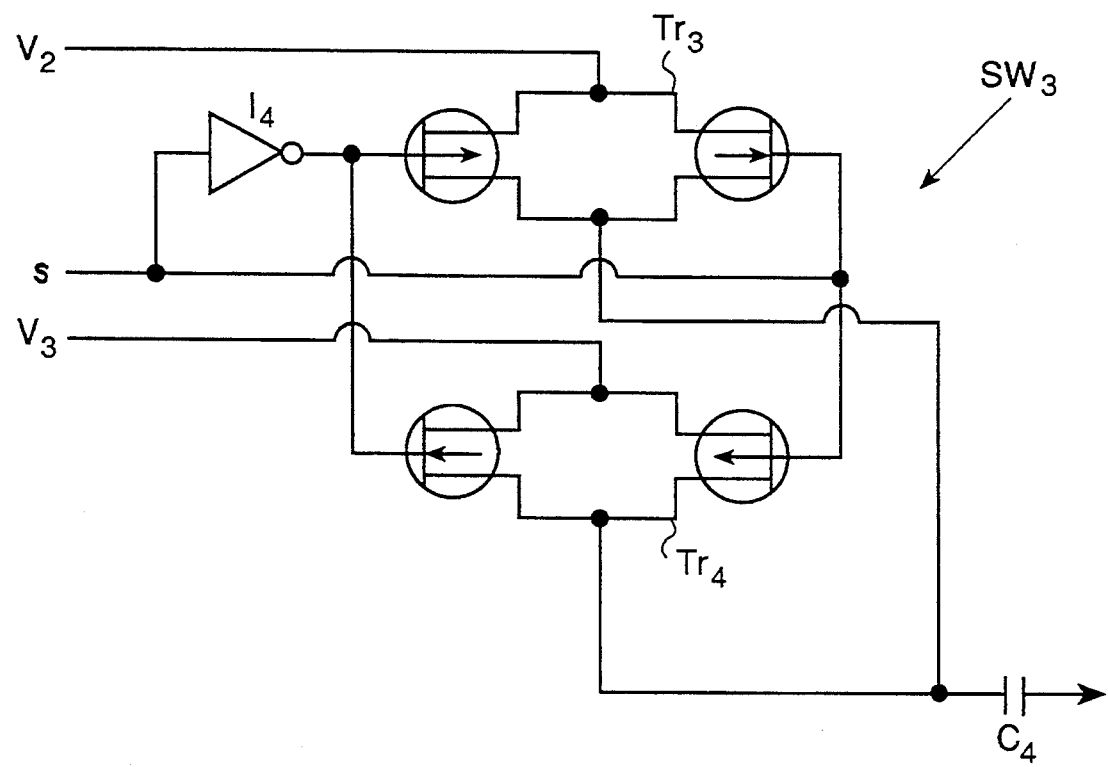
FIG. 5 is a circuit diagram showing the inside of a switching circuit $SW_9$.

FIG. 5 shows the switching circuit in detail. $V_2$ and $V_3$ are connected with a pMOS source side in two CMOSs $Tr_3$ and $Tr_4$, and pMOS drain side is connected with a common capacitance $C_4$. Sign bit s is directly input to a nMOS gate of $Tr_3$ and pMOS gate of $Tr_4$, and an signal inverted by an inverter $I_4$ is input to a gate of pMOS of $Tr_3$ and a gate of nMOS of $Tr_4$. When a sign bit s is equal to 1, then $Tr_3$ becomes conductive and an inverted output $V_2$ is impressed to $C_4$. When a sign bit s is equal to 0, then $Tr_4$ is conductive so that non-inverted output $V_3$ is impressed to $C_4$. Therefore, it is possible to generate positive and negative output corresponding to a sign bit.

As mentioned above, a multiplication circuit according to the present invention controls an analog input voltage by a switching signal of a digital voltage so as to generate an analog output or cut-off the outputs. A digital input signal of a plural number of bits is integrated giving weights by means of a capacitive coupling, and a sign bit is added by a capacitive coupling with a double weight of the MSB of the digital input so that it is possible to provide a multiplication circuit directly multiplying an analog and a digital data without converting analog/digital or digital/analog converting.

What is claimed is:

1. A multiplication circuit comprising:
   i) a capacitive coupling element which comprises a plurality of first capacitors connected in parallel with capacitive values corresponding to weights of each bit of a digital data;
   ii) a first switching circuit connected with the first capacitors of said capacitive coupling element, said switching circuit being opened and closed by a digital voltage corresponding to each bit of said digital data;
   iii) a first inverter connected with an output of said capacitive coupling element;
   iv) a second capacitor connected with an output of said first inverter;
   v) a second inverter connected with said first inverter through said second capacitor;
   vi) a second switching circuit connected with an output of the second inverter and said output of said first inverter for outputting alternatively one of said outputs; and
   vii) an analog input voltage connected with said first switching circuit.

2. A multiplication circuit as claimed in claim 1, wherein said first and the second switching circuits comprises CMOS.

3. A multiplication circuit as claimed in claim 1, wherein said first and second switching circuit comprises CMOS and a dummy transistor.

4. A multiplication circuit as claimed in claim 1, wherein said first inverter feeds back an output to an input through a capacitor with a capacitance equal to a total capacitance of a capacitive coupling.

5. A multiplication circuit as claimed in claim 1, wherein said second inverter is connected at said output with an input of said second inverter through a capacitor with capacity equal to a capacitance of said second capacitor, whereby said output is fed back to said input.

6. A digital/analog multiplier, comprising:
   a bridge of switching elements, each receiving an analog signal to be multiplied, and each receiving a respective bit of a digital signal to be multiplied, said bridge of switching elements selectively switching on or off voltages dependent on bit of said digital signal and producing an output signal indicative of a multiplication product between said analog signal and said digital signal;
   an inverting element, receiving the output of said bridge, and inverting a sense of an analog voltage represented thereby; and
   a switch, receiving a sign bit of the digital signal, and receiving an inverted an a non-inverted result of multiplication, said sign bit selecting which of said inverted or non-inverted output is produced.

7. A system as in claim 6 wherein said bridge includes a plurality of capacitors which sum together outputs of said switches.

8. A system as in claim 7 wherein said switches receive said digital bits to turn said switches on and off.

9. A system as in claim 7 wherein said capacitors have values which respectively weight various parts of the bridge.

10. A multiplier as in claim 6 wherein said inverting element includes at least three inverters in series.

11. A multiplier as in claim 10 wherein at least one of said inverters is of an nMOS type and at least another of said inverters is of a pMOS type.

* * * * *